United States Patent [19]

Snowden et al.

[11] Patent Number: 4,636,656
[45] Date of Patent: Jan. 13, 1987

[54] CIRCUIT FOR SELECTIVELY EXTENDING A CYCLE OF A CLOCK SIGNAL

[75] Inventors: Ralph E. Snowden; Robert D. Whitley, both of Austin, Tex.

[73] Assignee: Motorola, Inc., Schaumburg, Ill.

[21] Appl. No.: 612,212

[22] Filed: May 21, 1984

[51] Int. Cl.⁴ .................. H03K 3/017; H03K 5/04; G06F 15/00
[52] U.S. Cl. .................. 307/267; 307/470; 307/480; 328/58; 364/900
[58] Field of Search ... 364/200 MS File, 900 MS File; 328/58, 129.1; 307/265, 267, 470, 480

[56] References Cited

U.S. PATENT DOCUMENTS

| | | | |
|---|---|---|---|
| 3,656,123 | 4/1972 | Carnevale et al. | 364/200 |
| 4,050,096 | 9/1977 | Bennett et al. | 364/200 |
| 4,105,978 | 8/1978 | Gross et al. | 328/58 |
| 4,425,514 | 1/1984 | Orr et al. | 307/265 |
| 4,432,050 | 2/1984 | Harris et al. | 364/200 |
| 4,462,072 | 7/1984 | Tagne et al. | 364/200 |
| 4,507,732 | 3/1985 | Catiller et al. | 364/200 |

Primary Examiner—James D. Thomas
Assistant Examiner—Thomas C. Lee
Attorney, Agent, or Firm—John A. Fisher; Jeffrey Van Myers; Robert L. King

[57] ABSTRACT

A circuit comprising first, second and third latches selectively extends a cycle of a clock signal of a memory system in response to a control signal. A second clock signal having a frequency which is a predetermined multiple of the clock signal of the memory system is coupled to an input of the second and third latches. The first latch receives first and second control signals indicating the detection of parity errors in the memory system and suspends or delays the normal transition of the third latch which provides the memory system clock signal, thereby extending a cycle of the clock signal. The second latch resets the first latch which thereafter resets the third latch causing the clock signal to return to normal cycle operation.

8 Claims, 2 Drawing Figures

CIRCUIT FOR SELECTIVELY EXTENDING A CYCLE OF A CLOCK SIGNAL

TECHNICAL FIELD

This invention relates generally to clock signal circuits and, more particularly, to a circuit for selectively stretching a cycle of a clock signal in response to a control signal.

BACKGROUND ART

Memory systems typically utilize circuits which detect memory error signals from parity or error detection circuitry and which extend or stretch all memory cycles until an error detection delay interval has elapsed. A typical example of such a pulse expanding circuit is taught by Bennett et al. in U.S. Pat. No. 4,050,096 assigned to the assignee hereof. Although slow memory devices may be used in such a system, stretching all memory cycles substantially decreases the memory system performance by making the cycles much slower. A known alternative method to provide time for error detection in a memory system is to add wait cycles and postpone data processing cycles until the data error or errors have been detected. When wait cycles are inserted, fast memory devices are required to facilitate detection of errors and to keep from substantially delaying the output of the memory system. When either method is used, overall system speed is greatly reduced.

SUMMARY OF THE INVENTION

Accordingly, an object of the present invention is to provide an improved circuit for selectively extending a cycle of a clock signal.

Another object of the present invention is to provide an improved fast method for selectively stretching a clock signal in a memory system.

Yet another object of the present invention is to provide an improved circuit which detects a memory error in a memory system and which extends a system clock in response thereto.

In carrying out the above and other objects of the present invention, there is provided, in one form, a circuit which selectively extends a cycle of a first clock signal of a memory system. The circuit comprises first, second and third latches. A second clock signal having a predetermined multiple frequency of the first clock signal of the memory system is coupled to an input of the second and third latches. The third latch provides the first clock signal in response to the second clock signal. The first latch receives first and second control signals indicating the detection of valid parity errors in the memory system. Upon receipt of the first and second control signals, the first and second latches function in conjunction to inhibit the third latch from providing a transition of the first clock signal. The third latch therefore extends a cycle of the clock signal. Stretching the first clock signal of the memory system provides adequate time for the memory system to sample the error signal. The second latch resets the first latch which thereafter releases the third latch causing the clock signal to return to normal cycle operation. Since the present invention embodies a method of selectively extending a cycle of a memory system clock signal, the invention may be practiced by using differing types of latch circuits. In a preferred form, a fourth latch is provided which holds the first control signal for a predetermined amount of time.

DETAILED DESCRIPTION OF THE PRESENT INVENTION

Figure 1:
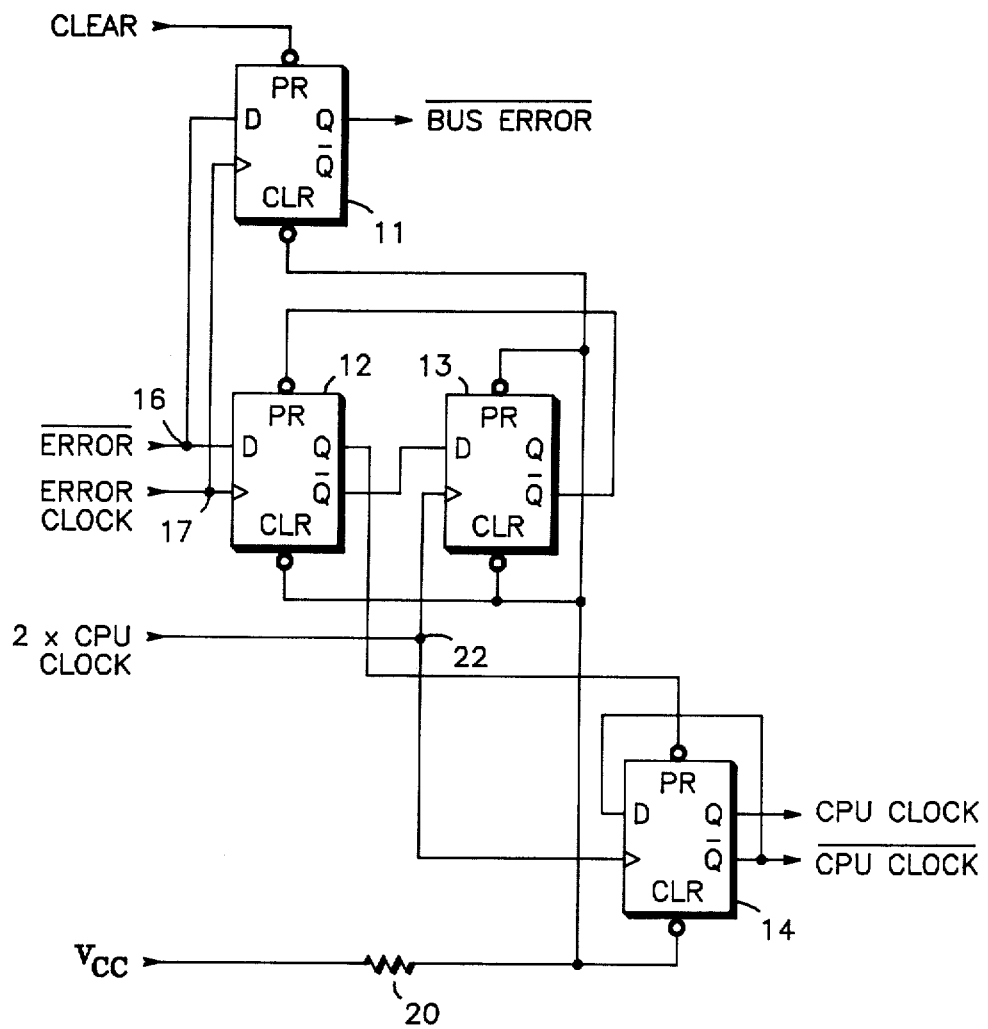
FIG. 1 illustrates in block diagram form a circuit for selectively extending a cycle of a clock signal in accordance with the present invention.

Shown in FIG. 1 is a circuit 10 having a plurality of D-type flip flops 11, 12, 13 and 14. Although a specific type of flip flop is illustrated, it should be well understood that the present invention may be practiced by using any type of latch circuit. Further, although the present invention is discussed in the context of a memory system and a CPU, the invention may also be utilized in any application requiring a clock stretching circuit. A first input of flip flop 11 labeled "D" is connected to a terminal 16 for receiving an error signal in complement form. A clock input of flip flop 11 is connected to a terminal 17 for receiving an error clock labeled "error clk". A first output of flip flop 11 labeled "Q" provides a bus error signal in complement form. Flip flop 11 has a preset terminal labeled "PR" coupled to a clearing signal labeled "clear". Flip flop 12 has a first input labeled "D" connected to terminal 16 and a clock input connected to terminal 17. A Q output of flip flop 12 is connected to a first input of flip flop 13 labeled "D". A $\overline{Q}$ output of flip flop 12 is connected to a preset terminal labeled "PR" of flip flop 14. A preset terminal of flip flop 12 also labeled "PR" is coupled to a $\overline{Q}$ output of flip flop 13. A clear terminal of flip flop 11 labeled "CLR" is connected to both a preset terminal "PR" and a clear terminal of flip flop 13, to a clear terminal of flip flop 12 labeled "CLR", to a clear terminal of flip flop 14 labeled "CLR", and to a first terminal of a resistor 20. A clock input of flip flop 13 is connected to a terminal 22 for receiving a signal labeled "2×CPU clk" which is a signal which is twice the frequency of a general CPU clock. A clock input of flip flop 14 is connected to the clock input of flip flop 13 at terminal 22. A D-type input of flip flop 14 is connected to a $\overline{Q}$ output of flip flop 14 which provides a CPU clock signal in inverse or complement form. A Q output of flip flop 14 provides the CPU clock signal. A second terminal of resistor 20 is coupled to a positive power supply voltage labeled $V_{CC}$.

Figure 2:
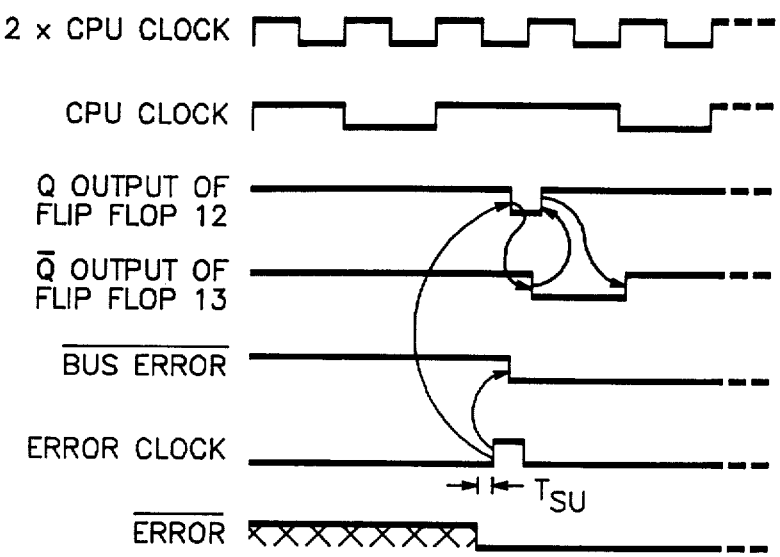
FIG. 2 illustrates in graphical form signals associated with the circuit of FIG. 1.

In operation, flip flop 12 is clocked by the error clock during each of a plurality of read data access frames of a memory system of which circuit 10 is a part of. Although only a portion of one read data access frame is shown in FIG. 2, the operation of circuit 10 in successive read data frames is analogous to the portion of the read data access frame illustrated. Flip flop 12 is clocked by the error clock at a time which is predetermined to be synchronous to both the 2×CPU clock and the error signal. In other words, the error clock is not free running but is derived from the 2×CPU clock and always occurs only once and at the same predetermined time in every read data access frame. The error signal is derived from parity circuitry not shown. It should be well understood that the present invention may be utilized with numerous types of error detection circuitry or may be used in systems which are not related to memory circuits. The error signal is not required to be valid until a predetermined set-up time ($T_{su}$) prior to the error clock transitioning from a low level to a high level. The set-up time is determined by the type of latch device which is used. Typical latch set-up times are approximately a couple of nanoseconds. That portion of the error signal illustrated in FIG. 2 which is cross-hatched indicates that error information has not yet been determined usually because the error detection and correction circuitry has not had enough time during the read data access frame to generate the error information. Therefore, any error signal occurring during the cross-hatched portion of a read data frame would not be valid. When flip flop 12 is in a quiescent state, the Q output of flip flop 12 is at a high logic level and the $\overline{Q}$ output is at a low logic level. If the complement of the error signal is at a high level when the error clock signal transitions from a low level to a high level, the Q output of flip flop 12 remains at a high level after the transition of the error clock signal. Since the preset terminal of flip flop 14 is an active low input, flip flop 14 is not preset until flip flop 12 is clocked to a low state by the error clock. A data error is indicated by the complement of the error signal being at a low level at the input of flip flop 12 when the error clock transitions from a low logic level to a high logic level as shown in FIG. 2. In response thereto, the $\overline{Q}$ output of flip flop 12 transitions from a low logic level to a high logic level and the Q output transitions inversely. Flip flop 12 couples a low logic level from its Q output to the preset terminal of flip flop 14 which holds the output of flip flop 14 suspended for one 2×CPU clock signal period. Flip flop 13 detects the transition from a low to a high level and generates an output pulse at its $\overline{Q}$ output to preset flip flop 12 back to a quiescent state at the next low to high transition of the 2×CPU clock signal. Not until the first rising clock edge of the 2×CPU clock after the Q output of flip flop 12 has transitioned back to a high logic level will the CPU clock signal return to a low logic level. At this point, circuit 10 returns to a normal state and the CPU clock runs symmetrically and undisturbed.

Flip flop 11 provides a bus error signal in complement form at its Q output in response to the receipt of a high level error clock signal during the valid period of time for detecting data errors. Flip flop 11 provides an indication to other circuitry in the memory system, such as an MPU, that a bus error has been detected by holding an error signal indication for a predetermined amount of time. Since the error clock is only a short clock signal, flip flop 11 latches the error indication. A preset terminal 23 of flip flop 11 is selectively coupled to a clear signal which causes the Q output of flip flop 11 to return to a high level a predetermined amount of time after the Q output has been at a low level. It should be well understood that the timing and the duration of the clear signal is irrelevant to the operation of that portion of circuit 10 which selectively stretches the clock signal.

By now it should be apparent that a circuit which selectively extends a cycle of a clock signal has been provided in conjunction with a method for doing the same. In one application, the circuit may be used in a memory system in conjunction with parity error detection circuitry. Because the present invention selectively extends only predetermined cycles of the clock signal, slower memory devices may be used in the memory system than would otherwise be required and overall system performance is improved.

What is claimed is:

1. A circuit for providing a clock signal and selectively extending a cycle of the clock signal during a predetermined time period established by a first control signal and in response to a second control signal, comprising:

first latch means having a first input for receiving the first control signal, a second input for receiving the second control signal a first output for providing an active state suspend signal in response to the receipt of the first control signal when the second control signal is in a predetermined logic state, a second output for providing a complement of the active state suspend signal, and a preset terminal for receiving a set signal which releases the suspend signal from the active state in response thereto;

second latch means having a first input coupled to the second output of the first latch means, a second input coupled to a terminal for receiving a modified clock signal having a predetermined multiple frequency of the clock signal, and an output coupled to the preset terminal of the first latch means for providing the set signal, said second latch means selectively providing the set signal in response to both the complement of the active state suspend signal and the modified clock signal; and third latch means having a first input for receiving the modified clock signal, a second input coupled to a first output thereof, a second output for providing the clock signal in response to the receipt of the modified clock signal, and a preset terminal coupled to the first output of the first latch means for setting the first and second outputs of the third latch means in response to the active state suspend signal thereby selectively extending a cycle of the clock signal.

2. The circuit of claim 1 further comprising:

fourth latch means having a first input for receiving the first control signal, a second input for receiving the second control signal, and an output for providing an output signal indicating receipt of the first control signal when the second control signal is in a predetermined logic state.

3. The circuit of claim 2 wherein the fourth latch means is a D-type flip-flop circuit.

4. The circuit of claim 1 wherein the first, second and third latch means are D-type flip-flop circuits.

5. A circuit for providing a clock signal with a first predetermined frequency and selectively extending a cycle of the clock signal during a predetermined time period established by a first control signal and in response to a second control signal, comprising:

first means having a first input for receiving the first control signal, a second input for receiving the second control signal, a first output for providing an active state suspend signal in response to the receipt of the first control signal when the second control signal is in a predetermined logic state, a second output for providing a complement of the active state suspend signal, and a control terminal for receiving a set signal which releases the suspend signal from the active state in response thereto;

second means coupled to the first means for receiving the complement of the active state suspend signal, said second means having an output coupled to the control terminal of the first means for providing the set signal in response to the complement of the active state suspend signal; having a first input coupled to a first output thereof, a second input coupled to a first terminal for receiving a clock signal with a second predetermined frequency, a second output for providing the clock signal at the first predetermined frequency in response to the clock signal of the second predetermined frequency, and a preset terminal coupled to the first output of the first means for presetting the first and second outputs of the third means in response to the active state suspend signal thereby selectively extending a cycle of the clock signal of first predetermined frequency.

6. The circuit of claim 5 further comprising:
fourth means having a first input for receiving the first control signal, a second input for receiving the second control signal, and an output for providing an output signal indicating receipt of the first control signal when the second control signal is in a predetermined logic state.

7. The circuit of claim 6 wherein the fourth means is a D-type flip-flop circuit.

8. The circuit of claim 5 wherein the first, second and third means are D-type flip-flop circuits.

* * * * *

UNITED STATES PATENT AND TRADEMARK OFFICE
CERTIFICATE OF CORRECTION

PATENT NO. : 4,636,656

DATED : January 13, 1987

INVENTOR(S) : Snowden, Ralph E. et al

It is certified that error appears in the above-identified patent and that said Letters Patent is hereby corrected as shown below:

In Claim 1, column 4, line 9, insert a comma between "signal" and "a".

In Claim 5, column 5, line 2, after the semicolon insert --and third means--.

Signed and Sealed this

Fourteenth Day of April, 1987

Attest:

DONALD J. QUIGG

*Attesting Officer*   *Commissioner of Patents and Trademarks*